United States Patent [19]
Fujio

[11] Patent Number: 6,147,909
[45] Date of Patent: Nov. 14, 2000

[54] NONVOLATILE SEMICONDUCTOR MEMORY DEVICE

[75] Inventor: Ryosuke Fujio, Tokyo, Japan

[73] Assignee: NEC Corporation, Tokyo, Japan

[21] Appl. No.: 09/330,081

[22] Filed: Jun. 11, 1999

[30] Foreign Application Priority Data

Jun. 29, 1998 [JP] Japan .................................. 10-182927

[51] Int. Cl.[7] .................................................. G11C 8/00
[52] U.S. Cl. ................................ 365/185.23; 365/185.29
[58] Field of Search ........................ 365/185.23, 185.29, 365/230.06, 185.18

[56] References Cited

U.S. PATENT DOCUMENTS 5,680,349  10/1997  Atsumi ................................ 365/185.23

Primary Examiner—A. Zarabian
Attorney, Agent, or Firm—Young & Thompson

[57] ABSTRACT

It is an object of the invention to provide an EEPROM, in which the third positive potential for erase verify is supplied from a negative potential generating circuit for supplying a negative or ground potential to a word line. The EEPROM is composed of a P potential supply circuit for respectively supplying a potential to sources of P channel transistors in invertors, which are respectively connected with word lines, a N potential supply circuit for respectively supplying a potential to sources of N channel transistors in the invertors, a read/write decision circuit for deciding whether the EEPROM operates in a read or write mode, and an erase decision circuit for deciding whether the EEPROM operates in an erase mode or not.

6 Claims, 4 Drawing Sheets

101 P CHANNEL TRANSISTOR
102, 105, 106, 510, 520 N CHANNEL TRANSISTOR
107, 108, 207, 208 ANALOG SWITCH
500 NEGATIVE POTENTIAL-PUMPING CIRCUIT
501 POSITIVE POTENTIAL-PUMPING CIRCUIT

101 P CHANNEL TRANSISTOR
102, 105, 106, 510, 520 N CHANNEL TRANSISTOR
107, 108, 207, 208 ANALOG SWITCH
500 NEGATIVE POTENTIAL-PUMPING CIRCUIT
501 POSITIVE POTENTIAL-PUMPING CIRCUIT

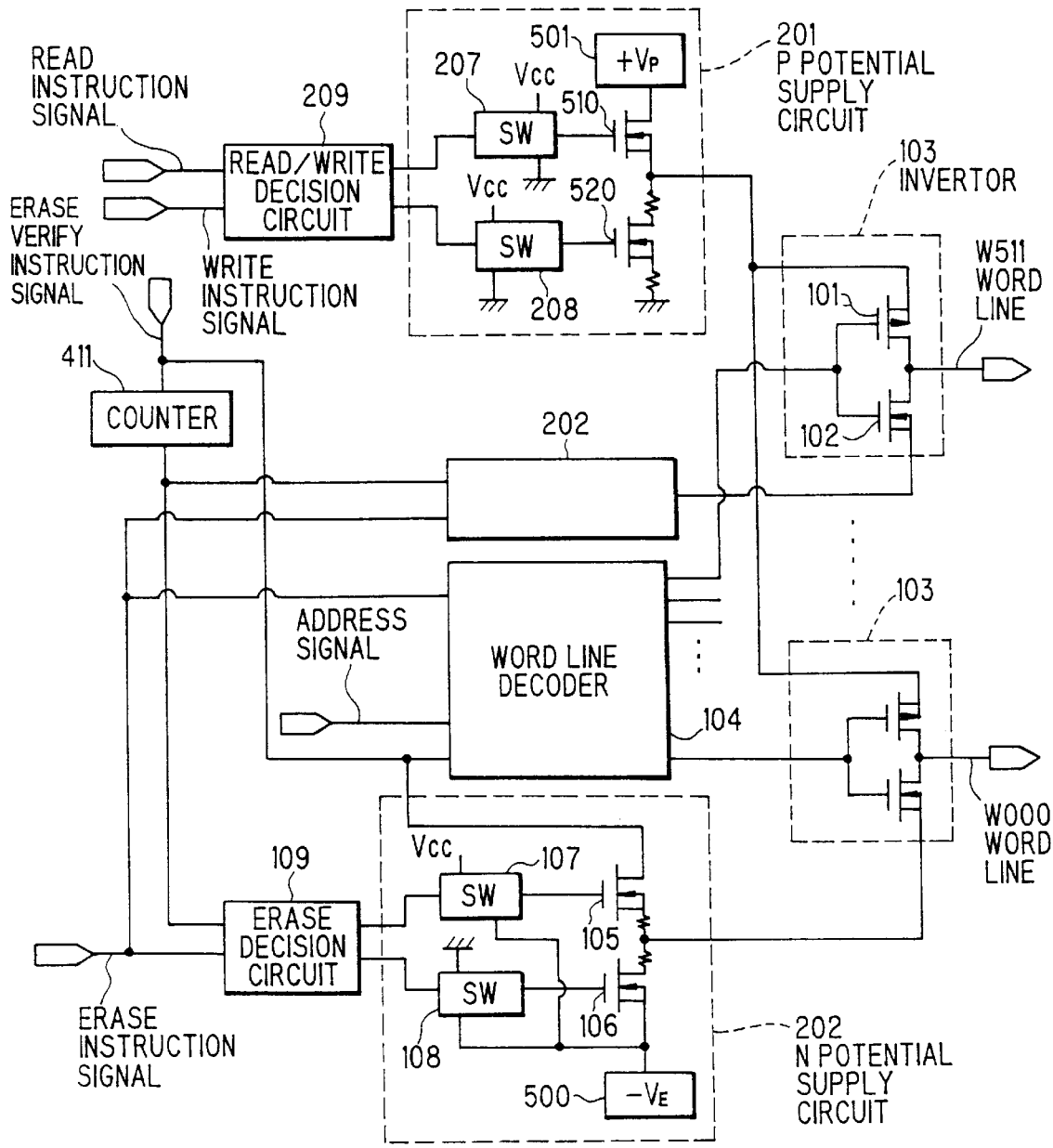

6,147,909

NONVOLATILE SEMICONDUCTOR MEMORY DEVICE

FIELD OF THE INVENTION

The invention relates to a nonvolatile semiconductor memory device (an electrically erasable and programmable read only memory: an EEPROM, hereinafter), and especially to an EEPROM provided with a control circuit, which generates the third positive potential necessary for erase verify in addition to the first positive potential necessary for reading a memory cell, the second positive potential for writing and a negative potential necessary for erasing.

BACKGROUND OF THE INVENTION

In order to read, write and erase the EEPROM, it is necessary to apply the first positive potential necessary for reading, the second positive potential necessary for writing and a negative potential necessary for erasing to the memory cell.

FIG. 1 shows a part of a decoding circuit of an EEPROM disclosed in Japanese Patent Kokai 5-28784, which is provided with a voltage-switching circuit having the function mentioned in the above. In this EEPROM, although a method for applying a negative potential to the gate of the memory cell transistor at the time of erase mode is adopted, there is no necessity for continuously operating a negative potential supply circuit, and the circuit structure of the word line driver is simplified.

As shown in FIG. 1, the gates of the memory cell transistors 11 are connected by a word line 12, and drains of the memory cell transistors 11 are connected by a bit line 13. Moreover, sources of the memory cell transistors 11 are connected by a source line 14. In the aforementioned memory cell array, the first positive potential (5V, for instance) is applied to the selected word line 12 and an intermediate read potential (1V, for instance) is applied to the selected bit line 13 at the time of read. At the time of write, the second positive potential (12V, for instance) is applied to the selected word line. Moreover, at the tie of erase, the first positive potential (5V, for instance) is applied to the source line 14, and a negative potential (−10V, for instance) is applied to the selected word line 12.

However, since the negative potential-generating circuit 10 shown in FIG. 1 used in the conventional EEPROM supplies the negative potential at the time of erase mode and the ground potential at the times of the other modes, it is not suited for erase verify mode.

SUMMARY OF THE INVENTION

Accordingly, it is an object of the invention to provide an EEPROM having a negative potential generating circuit which can supply not only a negative potential or the ground potential to a word line but also the third positive potential for erase verify to the same, keeping the scale of the circuit and the number of the wirings of a conventional EEPROM unchanged.

It is a further object of the invention to provide an EPROM having plural N potential supply circuits which are respectively provided for invertors and driven by a counter for counting numbers assigned to word lines.

According to the first feature of the invention, an EEPROM comprises:
 invertors respectively connected with word lines,
 a P potential supply circuit for supplying a potential to sources of P channel transistors in the invertors,
 a N potential supply circuits for supplying a potential to sources of N channel transistors in the invertors,
 a read/write decision circuit for deciding whether the EEPROM operates in a write or read mode, and
 an erase decision circuit for deciding whether the EEPROM operates in an erase mode or not,
  wherein the P potential supply circuit outputs one of a first positive potential, a second positive potential and a ground potential; and the N potential supply circuit outputs one of a third positive potential, a ground potential and a negative potential in accordance with output signals of the read/write decision circuit and the erase decision circuit.

According to the second feature of the invention, an EEPROM comprises:
 invertors respectively connected with word lines,
 a P potential supply circuit for supplying a potential to sources of P channel transistors in the invertors,
 plural N potential supply circuits, which are respectively provided for the invertors and supply potentials to sources of N channel transistors in the invertors,
 a read/write decision circuit for deciding whether the EEPROM operates in a write or read mode,
 a erase decision circuit for deciding whether the EEPROM operates in an erase mode or not,
  wherein the P potential supply circuit outputs one of a first positive potential, a second positive potential and a ground potential; and the N potential supply circuits output one of a third positive potential, a ground potential and a negative potential in accordance with output signals of the read/write decision circuit and the erase decision circuit, and
 a counter, which counts numbers assigned to the word lines responding to the third positive potential serving as a trigger signal and drives the plural N potential supply circuits based on an output of the counter.

BRIEF DESCRIPTION OF THE DRAWINGS

The invention will be explained in more detail in conjunction with appended drawings, wherein:

FIG. 5 is a block diagram for showing a structure of an EEPROM according to the second preferred embodiment of the invention.

DESCRIPTION OF THE PREFERRED EMBODIMENT

Thereafter, embodiments of the invention will be explained referring to the appended drawings.

Figure 1:
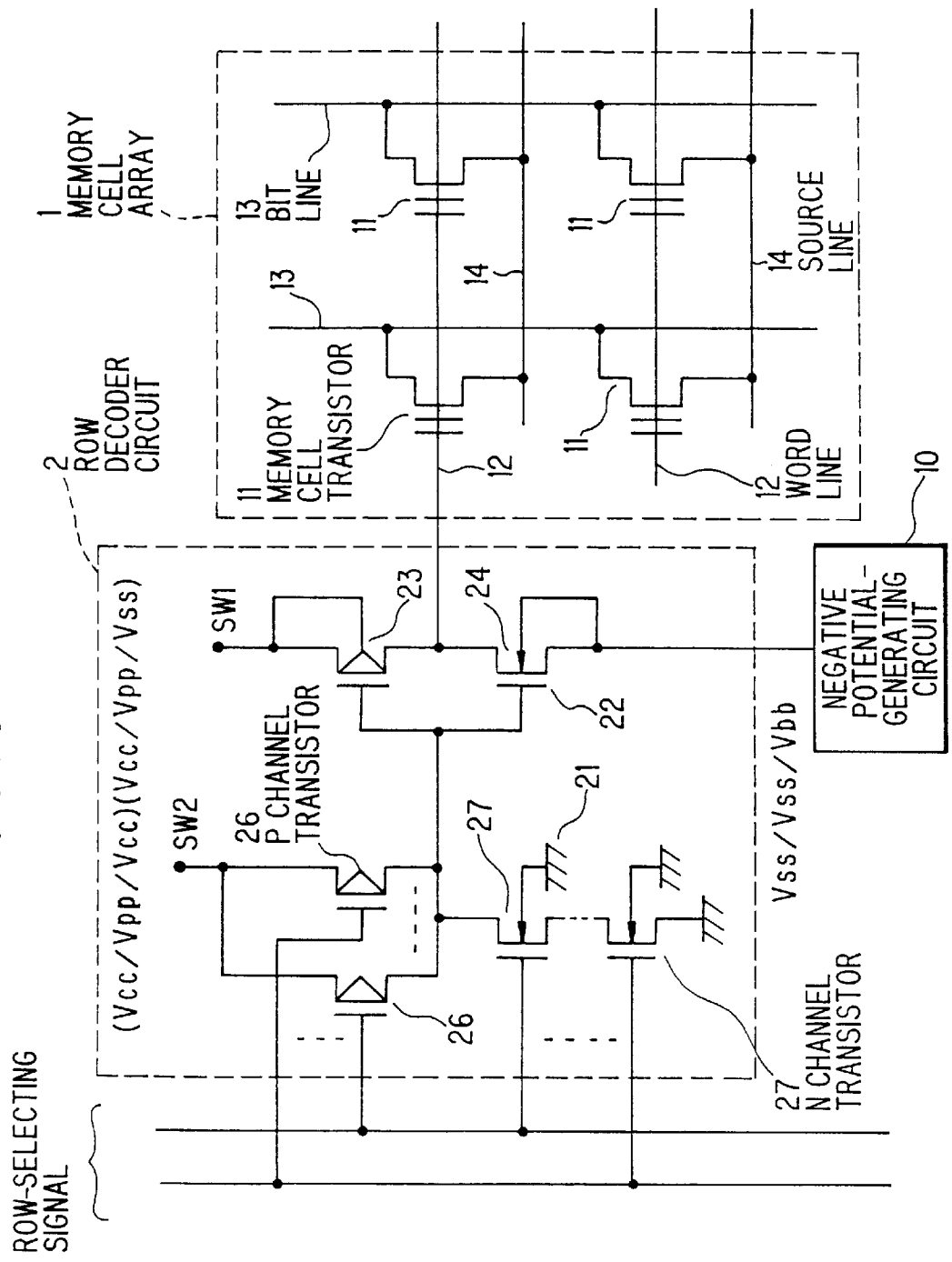
FIG. 1 is a block diagram for showing a conventional EEPROM.
Figure 2:
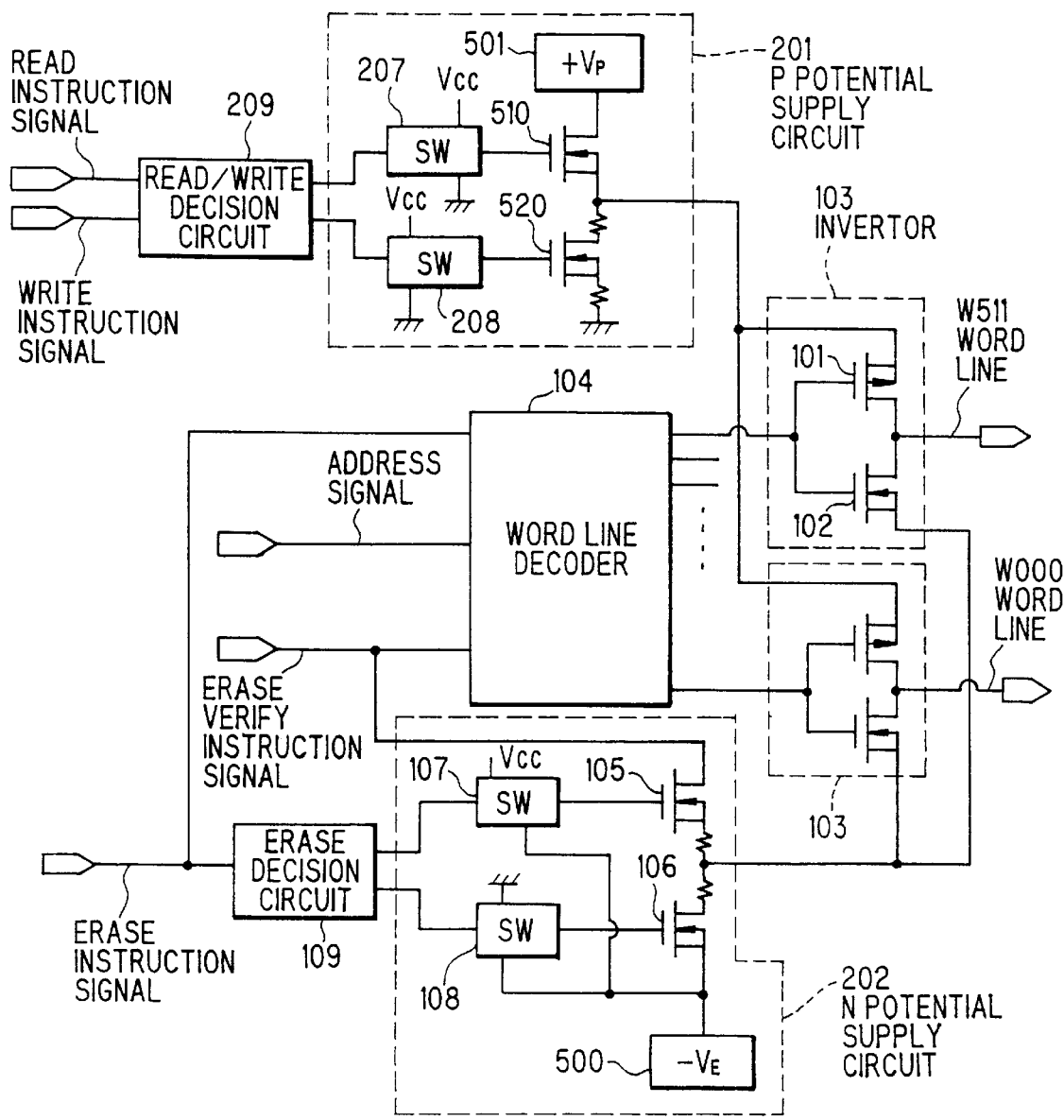
FIG. 2 is a block diagram for showing a structure of an EEPROM according to the first preferred embodiment of the invention.

FIG. 2 is a block diagram for showing an EEPROM according to the invention.

The structure of the EEPROM according to the invention will be explained referring to FIG. 2. As shown in FIG. 2, the EEPROM is provided with 512 word lines.

As shown in FIG. 2, the EEPROM according to the invention is composed of 512 invertors 103 connected with the word lines W000 to W511, a P potential supply circuit 201 for supplying a potential to sources of P channel transistors 101 in the invertors 103, a N potential supply circuit 202 for supplying a potential to sources of N channel transistors 102 in the invertors 103, a read/write decision circuit 209 for deciding whether the EEPROM operates in a read or write mode, and a erase decision circuit 109 for deciding whether the EEPROM operates in an erase mode or not.

The sources of the P channel transistors 101 in the respective invertors 103 are commonly connected with the P potential supply circuit 201. Similarly, the sources of the N channel transistors 102 of the respective invertors 103 are commonly connected with the N potential supply circuit 202. Moreover, outputs of a word line decoder 104 are respectively supplied to the invertors 103.

Moreover, the P potential supplying circuit 201 comprises a N channel transistor 510 connected with an analog switch 207 and a N channel transistor 520 connected with an analog switch 208. A source of the N channel transistor 510 and a drain of the N channel transistor 520 are connected with each other.

The N potential supply circuit 202 comprises a N channel transistor 105 connected with a switch 107 and a N channel transistor 106 connected with a switch 108. A source of the N channel transistor 105 and a drain of the N channel transistor 106 are connected with each other.

The erase decision circuit 109 is supplied with an erase instruction signal, and supplies output signals to the analog switches SW 107 and 108 of the N potential supply circuit 202 on the basis of the erase instruction signal.

The read/write decision circuit 209 is supplied with a write or read instruction signal, and supplies output signals to the analog switches 207 and 208 of the P potential supply circuit 201 on the basis of the write or read instruction signal.

The word line decoder 104 is supplied with an erase instruction signal, an address signal and an erase verify instruction signal, and supplies an output signal or output signals to the invertor or the invertors 103 on the basis of an erase instruction signal, the address signal or an erase verify instruction signal.

Figure 3:
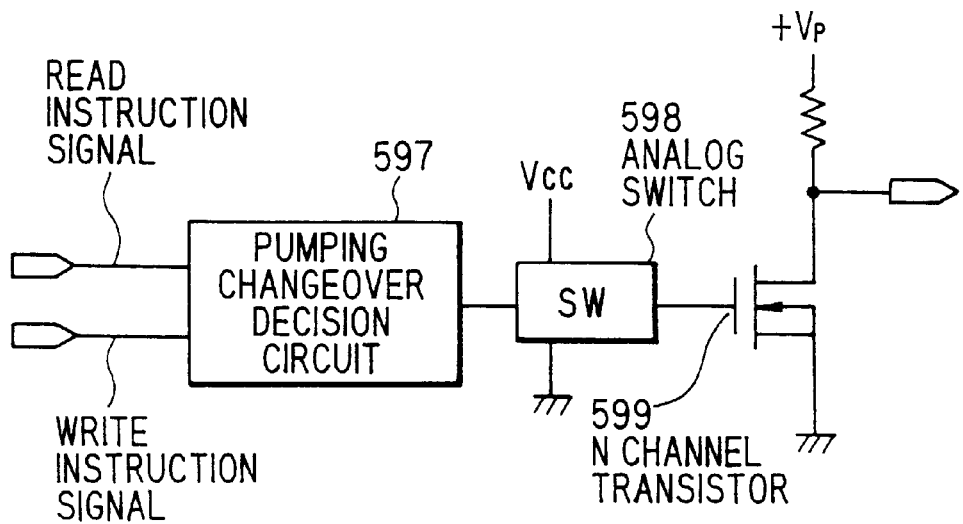
FIG. 3 is a block diagram for showing a positive potential-pumping circuit.

Thereafter, the structure of a positive potential-pumping circuit 501 will be explained referring to FIG. 3. As shown in FIG. 3, the positive potential-pumping circuit 501 is composed of a pumping changeover decision circuit 597 which is supplied with the write instruction signal and the read instruction signal, an analog switch 598 which is supplied with the output signal of the pumping changeover decision circuit 597, and a N channel transistor 599 which is supplied with the output signal of the analog switch 598. A cascode connection of N channel transistors can be adopted instead of the N channel transistor 599. A P channel transistor can be adopted instead of the N channel transistor.

Figure 4:
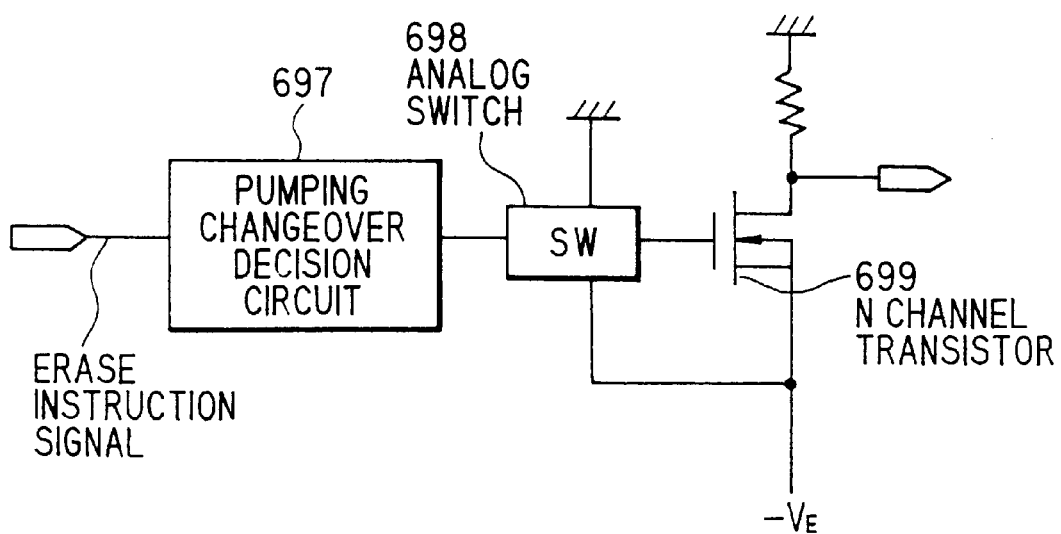
FIG. 4 is a block diagram for showing a negative potential-pumping circuit.

FIG. 4 is a block diagram for showing the structure of a negative potential-pumping circuit 500. As shown in FIG. 4, the negative potential-pumping circuit 500 is composed a pumping changeover decision circuit 697 which is supplied with the erase instruction signal, an analog switch 698 which is supplied with the output signal of the pumping changeover decision circuit 697, and a N channel transistor 699 which is supplied with the output signal of the analog switch 698. A cascode connection of N channel transistors can be adopted instead of the N channel transistor 699.

The structure of the EEPROM according to the invention has been explained in the above. Next, the operation of the EEPROM according to the invention will be explained.

At the time of read or write, the word line decoder 104 is supplied with an address signal from the outside, decodes it, and applies an active low logical level to one of the output lines of the word line decoder 104. Then, the active low logical level is applied to one of the invertors 103. A selected word line is supplied with the first positive potential of about 5V at the time of read and the second positive potential of about 12V at the time of write via the P channel MOS transistor 101 in the invertor 103.

Next, the operation of the P potential supply circuit at the times of read and write will be further explained.

First, at the time of read or write, the output of the positive potential-pumping circuit 501 is changed to a positive potential (+VP).

At the time of read, the read/write decision circuit 209 turns off both the analog switches 207 and 208 based on the active read instruction signal and the inactive write instruction signal, and supplies a power supply voltage Vcc (5V, for instance) to gates of both the N channel transistors 510 and 520. Accordingly, both the N channel transistors 510 and 520 turn on. Then, the first positive potential of about 5V is applied to a source of the P channel MOS transistor 101 in the invertor 103. In order to adjust the first positive potential, resistors may be connected with a drain and/or a source of the N channel transistor 520.

At the time of write, the read instruction signal is inactive, and the write instructive signal is active. Then, the read-write decision circuit 209 turns off the analog switch 207, and supplies the power supply voltage Vcc (5V, for instance) to the gate of the N channel transistor 510. Moreover, the read/write decision circuit 209 turns on the analog switch 208, and supplies the ground potential to the gate of the N channel transistor 520. In this way, the N channel transistor 510 turns on, and the N channel transistor 520 turns off. Accordingly, the second positive potential of about 12V is applied to the source of the P channel transistor 101 in the invertor 103 from the positive potential-pumping circuit 501. In order to adjust the second positive potential, resistors may be connected with the drain and/or the source of the N channel transistor 520.

In the aforementioned cases, since the erase instruction signal is inactive, the analog switch SW 107 turns off on based on the output signal of the erase decision circuit 109 and a power supply voltage Vcc of about 5 v is applied to the gate of the N channel transistor 105. At the same time, the analog switch SW 108 turns on, and a negative potential of −VE (−12, for instance) is applied to the gate of the N channel transistor 106. Then, the N channel transistor 105 turns on, and the N channel transistor 106 turns off. Accordingly, the erase verify signal is supplied to the source of the N channel transistor 102 in the invertor 103 from the N channel transistor 105. In this case, since the erase verify signal is inactive and at the ground potential, the ground potential is applied to the source of the N channel transistor 102 in the invertor 103.

Next, the operation of the EEPROM according to the invention at the time of erase will be explained.

In this case, since an erase instruction signal is active, the analog switch SW 107 turns on and the analog switch SW 108 turns off based on the output signal of the erase decision circuit 109. Since the analog switch 107 turns on, a negative potential −VE (−12V, for instance) is supplied to the gate of the N channel transistor 105. Moreover, since the analog switch SW 108 turns off, the ground potential is supplied to the gate of a N channel transistor 106. Then, the N channel transistor 105 turns off, and the N channel transistor 106 turns on. Accordingly, the negative potential of −VE (−12V, for instance9 is supplied to the source of the N channel transistor 102 in the invertor 3 via the N channel transistor 106.

On the otherhand, the word line decoder 104 which is supplied with the erase instruction signal applies a low logical level to all the output lines thereof and all the word lines are selected. At the same time, the potential applied to the source of the P channel transistor 101 in the invortor 103 is change to the ground potential. That is to say, the outputs of the P potential supply circuit 201 is changed to the ground potential.

Now then, the operation of the P potential supply circuit 201 at this time will be explained. The P potential supply circuit 201 is supplied with the inactive read instruction signal and the inactive write instruction signal, and turns on both the analog switches 207 and 208. Then, the ground potential is supplied to the gates of both the N channel transistors 510 and 520. At the same time, the output of the positive potential pumping circuit 501 is changed to the ground potential. In this way, the potential applied to the source of the P channel transistor 101 in the invertor 103 is changed to the ground potential.

Accordingly, the P channel transistor 101 in the invertor 103 turns off, the N channel transistor 102 in the same turns on, and the wordlines are supplied with a negative potential −VE (−12V, for instance).

Next, the operation of the EEPROM according to the invention at the time of erase verify mode will be explained.

In this case, since the erase verify instruction signal is activated, the word line decoder 104 applies a high logical level to all the output lines thereof, and brings all the word lines to the non-selective states. At the same time, the potential of the sources of the P channel transistors in the invertors 103 is changed to Vcc.

When the operation of the EEPROM is shifted to an erase verify mode from an erase mode, the erase instruction signal is inactivated, the negative potential-pumping circuit 500 stops generating the negative potential (−VE), and the output thereof is changed to the ground potential from the negative potential. At the same time, since the erase instruction signal is inactivated, the analog switch SW 107 turns off and the power supply voltage Vcc is supplied to the gate of the N channel transistor 105, hence the N channel transistor 105 turns on. At this time, the analog switch 108 turns on, and the ground potential is supplied to the N channel transistor 106 from the negative potential-pumping circuit 500. Then, the N channel transistor 106 turns off. Accordingly, the N channel supplying circuit 202 outputs the third positive potential via the N channel transistor 105. In order to adjust the third positive potential, resistors may be connected with the source of the N channel transistor 105 and the drain of the N channel transistor 106.

The third positive potential is referred in order to confirm whether the upper limit of an erased level is the disread one or not, and set at 2.5V for instance. In case of over erase verify, in which whether the lower limit of an erased level is the desired one or not is confirmed, the third positive potential is set at 0.5V for instance.

A preferred embodiment of the invention has been explained in the above. Although the sources of the N channel transistors 102 in the invertors 103 are commonly connected with the N potential supply circuit 202 in the aforementioned embodiment, these sources can be made to be independent of each other.

FIG. 5 shows an EEPROM according to the invention, in which the sources of the N channel transistor 102 in the invertors 103 are independent of each other.

The EEPROM shown in FIG. 5 is provided with 512 N potential supply circuits 202 for instance, the number of which is the same as that of the word lines W000 to W511.

The difference between the embodiments shown in FIGS. 2 and 5 is that the embodiment shown in FIG. 5 is provided with a counter 411 and the erase decision circuit 109 is supplied with the output of the counter 411 in addition to the erase instruction signal.

The counter 411 outputs the erase verify signal as a trigger signal and successively select one of the N potential-supply circuits 202.

The operations of read, write and erase in the EEPROM shown in FIG. 5 are the same as those of the EEPROM shown in FIG. 2.

At the time of erase verify operation, since the erase verify instruction signal is activated, the word line decoder 104 applies a high logical level to all the output lines thereof, and brings all the word lines to the non-selective states. Moreover, the output of the P potential supply circuit 201 is changed to the first positive potential from the ground potential level which is outputted therefrom at the time of the erase mode.

Since the erase instruction signal has been already inactivated, the negative potential-pumping circuit 500 stops supplying the negative potential (−VE), and the output thereof is at the ground potential level.

Under the aforementioned condition, only the N potential-supplying circuit 202 selected by the counter 411 inter-changes the output signal thereof. That is to say, in the activated N potential supply circuit 202 turns off the analog switch 107 and turns on the analog switch 108 based on the output signal of the erase decision circuit 109 similarly to the case of FIG. 2. Then, the N channel transistor 105 turns on, and the N channel transistor 106 turns off. As the result, the N potential supply circuit 202 selected by the counter 411 outputs the third positive potential for erase verify.

On the other hand, in the N potential supply circuit 202 which is not selected by the counter 411, the analog switch 107 and the N channel transistor 105 turn off; and the analog switch 108 and the N channel transistor 106 turn on.

As the result, the N potential supply circuit 202 which is not selected by the counter 411 outputs the ground potential.

When erase verify of the selected word line is over by the aforementioned process, the number of the counter 411 is increased by one, and the next N potential supply circuit 202 is activated.

In the above, the EEPROM, in which the sources of the N channel transistors 102 in the invertors 103 are independent of each other, has been explained referring to FIG. 5.

The embodiments of the invention are not restricted to those shown in FIGS. 2 and 5. For example, the plural sources of the N channel transistors 102 in the invertors 103 may be commonly connected, and driven similarly.

According to the invention explained in the above, the third positive potential for erase verify can be supplied from the negative potential-generating circuit, which originally supplies the negative or ground potential to the word line. Accordingly, the EEPROM according to the invention can perform erase verify keeping the scale of the circuit and the number of the wirings of the conventional EEPROM unchanged.

According to the invention, an EEPROM, which acts on memory cells in the read, write, erase and erase verify modes using a positive potential only, can be realized.

What is claimed is:

1. A nonvolatile semiconductor memory device (an electrically erasable and programmable read only memory, EEPROM, comprising:

invertors respectively connected with word lines, a P potential supply circuit for supplying a potential to sources of P channel transistors in said invertors, a N potential supply circuit for supplying a potential to sources of N channel transistors in said invertors, a read/write decision circuit for deciding whether said EEPROM operates in a write or read mode, and an erase decision circuit for deciding whether said EEPROM operates in an erase mode or not, wherein said P potential supply circuit outputs one of a first positive potential, a second positive potential and a ground potential; and said N potential supply circuit outputs one of a third positive potential, a ground potential and a negative potential in accordance with output signals of said read/write decision circuit and said erase decision circuit.

2. An EEPROM accordance to claim 1, wherein:

said P potential supply circuit comprises:

a positive potential-pumping circuit for selectively outputting said second positive potential or said ground potential, a cascode connection of two N channel transistors, and two analog switches respectively connected with gates of said two N channel transistors, wherein one end of said cascode connection is connected with said positive potential-pumping circuit and another end of said cascode connection is connected with said ground potential.

3. An EEPROM according to claim 1, wherein:

said N potential supply circuit comprises:

a negative potential-pumping circuit for selectively outputting said negative potential or said ground potential, a cascode connection of two N channel transistors, and two analog switches respectively connected with gates of said two N channel transistors, wherein one end of said cascode connection is connected with said negative potential-pumping circuit and another end of said cascode connection is connected with an erase verify signal supply terminal.

4. An EEPROM according to claim 1, wherein:

said sources of said P channel transistors in said invertors are commonly connected with an output terminal of said P potential supply circuit, and said sources of said N channel transistors in said invertors are commonly connected with an output terminal of said N potential supply circuit.

5. An EEPROM accordance to claim 3, wherein:

said two analog switches are driven by an erase instruction signal.

6. An EEPROM comprising:

invertors respectively connected with word lines, a P potential supply circuit for supplying a potential to sources of P channel transistors in said invertors, plural N potential supply circuits, which are respectively provided for said invertors and supply potentials to sources of N channel transistors in said invertors, a read/write decision circuit for deciding whether said EEPROM operates in a write or read mode, a erase decision circuit for deciding whether said EEPROM operates in an erase mode or not, wherein said P potential supply circuit outputs one of a first positive potential, a second positive potential and a ground potential; and said N potential supply circuits output one of a third positive potential, a ground potential and a negative potential in accordance with output signals of said read/write decision circuit and said erase decision circuit, and a counter, which counts numbers assigned to said word lines responding to said third positive potential serving as a trigger signal and drives said plural N potential supply circuits based on an output of said counter.

* * * * *